(12) United States Patent
Kang et al.

(10) Patent No.: US 12,431,090 B2
(45) Date of Patent: Sep. 30, 2025

(54) DISPLAY APPARATUS HAVING A LIGHT-EMITTING DEVICE

(71) Applicant: LG Display Co., Ltd., Seoul (KR)

(72) Inventors: Min Joo Kang, Paju-si (KR); Suk Yang, Paju-si (KR); Hee Suk Pang, Paju-si (KR); Joo Hwan Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/902,640

(22) Filed: Sep. 30, 2024

(65) Prior Publication Data

US 2025/0029564 A1 Jan. 23, 2025

Related U.S. Application Data

(63) Continuation of application No. 18/063,563, filed on Dec. 8, 2022, now abandoned.

(30) Foreign Application Priority Data

Dec. 30, 2021 (KR) ........................ 10-2021-0193495

(51) Int. Cl.
*G09G 3/32* (2016.01)
*G09G 3/3266* (2016.01)
*H10K 59/123* (2023.01)

(52) U.S. Cl.
CPC ......... *G09G 3/3266* (2013.01); *H10K 59/123* (2023.02); *G09G 2300/0408* (2013.01);
(Continued)

(58) Field of Classification Search
CPC ............... G09G 3/3266; G09G 3/32; G09G 2300/0408; G09G 2300/0426;
(Continued)

(56) References Cited

U.S. PATENT DOCUMENTS 10,475,861 B2 11/2019 Lee et al.
10,861,909 B2 12/2020 Park
(Continued)

FOREIGN PATENT DOCUMENTS

KR 20160142763 A 12/2016
KR 20170029162 A 3/2017
(Continued)

*Primary Examiner* — Pegeman Karimi
(74) *Attorney, Agent, or Firm* — Seed Intellectual Property Law Group LLP

(57) ABSTRACT

A display apparatus including a light-emitting device is provided. The light-emitting device is disposed on a display area of a device substrate. An over-coat layer between the device substrate and the light-emitting device extends onto a bezel area. A moisture-blocking hole penetrating the over-coat layer is disposed on the bezel area. At least a portion of the moisture-blocking hole is filled by an encapsulating element disposed on the light-emitting device. A front adhesive layer covering the encapsulating element may attach an encapsulation substrate to the device substrate in which the light-emitting device and the encapsulating element are formed. A variable adhesive layer is disposed between the encapsulating element and the front adhesive layer and/or the over-coat layer and the front adhesive layer of the bezel area. Thus, in the display apparatus, the penetration of external moisture may be blocked, and the process efficiency and the productivity may be improved.

23 Claims, 9 Drawing Sheets

(52) U.S. Cl.
CPC .............. *G09G 2300/0426* (2013.01); *G09G 2310/0291* (2013.01); *G09G 2320/0223* (2013.01)

(58) Field of Classification Search
CPC ... G09G 2310/0291; G09G 2320/0223; G09G 3/3233; H10K 59/123; H10K 59/131; H10K 50/841; H10K 50/844; H01L 27/1248; H01L 27/1225; G09F 9/335

See application file for complete search history.

(56) References Cited

U.S. PATENT DOCUMENTS

| | | | |
|---|---|---|---|
| 2017/0004790 | A1 | 1/2017 | Kitsomboonloha et al. |
| 2018/0175115 | A1* | 6/2018 | Choi ................... H10K 59/126 |
| 2019/0189722 | A1* | 6/2019 | Lim ...................... H10D 86/60 |
| 2019/0189975 | A1* | 6/2019 | Lim ................... H10D 30/6755 |
| 2019/0325838 | A1 | 10/2019 | Tagawa et al. |
| 2020/0013849 | A1* | 1/2020 | Kim .................... H10K 59/123 |
| 2020/0273941 | A1 | 8/2020 | Cha et al. |

FOREIGN PATENT DOCUMENTS

| | | |
|---|---|---|
| KR | 20180078672 A | 7/2018 |
| KR | 20200025916 A | 3/2020 |

\* cited by examiner

DISPLAY APPARATUS HAVING A LIGHT-EMITTING DEVICE

CROSS-REFERENCE TO RELATED APPLICATIONS

This application claims the benefit of Korean Patent Application No. 10-2021-0193495, filed on Dec. 30, 2021, which is hereby incorporated by reference as if fully set forth herein.

BACKGROUND

Technical Field

The present disclosure relates to a display apparatus in which a light-emitting device is disposed on a display area of a device substrate.

Description of the Related Art

Generally, a display apparatus provides an image to user. For example, the display apparatus may include a plurality of light-emitting device. Each of the light-emitting devices may emit light displaying a specific color. For example, the light-emitting device may include a light-emitting layer disposed between a first electrodes and a second electrode.

The light-emitting layer may be vulnerable to moisture. For example, in the display apparatus, a device substrate in which the light-emitting devices are formed may be bonded to an encapsulation substrate by using a front adhesive layer. The front adhesive layer and the encapsulation substrate may block the penetration of external moisture, and relieve external impact.

BRIEF SUMMARY

The front adhesive layer used in the related art, for example, may include moisture-absorbing particles, and the encapsulation substrate may include a metal. The penetration of external moisture may also be made from a side surface of the display apparatus. However, if the bezel area is increased for blocking the penetration of the external moisture through the side of the display apparatus, a display area of the display apparatus may be reduced.

In addition, in the display apparatus, the light-emitting devices may be damaged in a process of separating the encapsulation substrate for re-work by the adhesive force of the front adhesive layer. For example, in the display apparatus, a gap may be generated between the light-emitting layer and the second electrode of each light-emitting device in the process of separating the encapsulation substrate. Thus, in the display apparatus, the quality of the image may be deteriorated, and the process efficiency and the productivity may be decreased.

Accordingly, one or more embodiments of the present disclosure is directed to a display apparatus that substantially obviates one or more technical problems due to limitations and disadvantages of the related art including the problems identified above.

One or more embodiments of the present disclosure provide a display apparatus capable of preventing the penetration of the external moisture and improving the process efficiency and the productivity.

One or more embodiments of the present disclosure provide a display apparatus capable of separating the encapsulation substrate without the damage of the light-emitting device.

Additional advantages, technical benefits, and features of the disclosure will be set forth in part in the description which follows and in part will become apparent to those having ordinary skill in the art upon examination of the following or may be learned from practice of the disclosure. The benefits and other advantages of the disclosure may be realized and attained by the structure particularly pointed out in the written description and claims hereof as well as the appended drawings.

According to one embodiment, a display apparatus comprising a device substrate is provided. The device substrate includes a display area and a bezel area. An over-coat layer is disposed on the display area and the bezel area of the device substrate. A light-emitting device is disposed on the over-coat layer of the display area. A moisture-blocking hole is disposed on the bezel area of the device substrate. The moisture-blocking hole penetrates the over-coat layer of the bezel area. An encapsulating element is disposed on the light-emitting device. The encapsulating element fills at least a portion of the moisture-blocking hole. The encapsulating element is covered by a front adhesive layer. An encapsulation substrate is disposed on the front adhesive layer. The encapsulation substrate overlaps the display area and the bezel area of the device substrate. A variable adhesive layer is disposed between the encapsulating element and the front adhesive layer.

The variable adhesive layer may include an adhesive material layer and variable beads. The variable beads may be dispersed in the adhesive material layer. The variable beads may include a material in which a volume is changed by heat or UV.

The encapsulating element may have a stacked structure of an inorganic encapsulating layer and an organic encapsulating layer. The inorganic encapsulating layer may include an inorganic insulating material. The organic encapsulating layer may include an organic insulating material.

An end of the organic encapsulating layer may be disposed in the moisture-blocking hole.

The variable adhesive layer may extend outside the display area along between the encapsulating element and the front adhesive layer.

An end of the variable adhesive layer may be in contact with the over-coat layer of the bezel area.

In another embodiment, there is provided a display apparatus comprising a device substrate. A first electrode is disposed on a display area of the device substrate. An over-coat layer is disposed between the device substrate and the first electrode. The over-coat layer extends onto a bezel of the device substrate. An edge of the first electrode is covered by a bank insulating layer. The bank insulating layer extends on the over-coat layer of the bezel area. A light-emitting layer and a second electrode are stacked on a portion of the first electrode exposed by the bank insulating layer. The light-emitting layer and the second electrode extend on the bezel area of the device substrate along a surface of the bank insulating layer. A moisture-blocking hole is disposed on the bezel area of the device substrate. The moisture-blocking hole penetrates the over-coat layer, the bank insulating layer, the light-emitting layer and the second electrode of the bezel area. An encapsulating element is disposed on the second electrode. The encapsulating element extends inside the moisture-blocking hole. A front adhesive layer is disposed on the encapsulating element. The front adhesive layer extends outside the moisture-blocking hole. An encapsulation substrate is disposed on the front adhesive layer. The encapsulation substrate overlaps the display area and the bezel area of the device substrate. An outer variable adhesive layer is disposed outside the bank insulating layer, the light-emitting layer and the second electrode. The outer variable adhesive layer is disposed between the over-coat layer and the front adhesive layer of the bezel area.

The outer variable adhesive layer may have a closed curve shape extending along an edge of the display area.

An inner variable adhesive layer may be disposed between the encapsulating element and the front adhesive layer of the display area. The inner variable adhesive layer may extend outside the display area. The inner variable adhesive layer may be spaced away from the outer variable adhesive layer.

The inner variable adhesive layer may include the same material as the outer variable adhesive layer.

The moisture-blocking hole may be disposed between the inner variable adhesive layer and the outer variable adhesive layer.

The encapsulating element may include an organic encapsulating layer and an inorganic encapsulating layer. The inorganic encapsulating layer may be disposed on the organic encapsulating layer. The inorganic encapsulating layer may be spaced away from the inner variable adhesive layer.

The inner variable adhesive layer may be in contact with the organic encapsulating layer.

The inorganic encapsulating layer may include a region overlapping with the moisture-blocking hole.

A capping layer may be disposed between the second electrode and the encapsulating element of the display area. The capping layer may extend onto the bezel area of the device substrate. The moisture-blocking hole may penetrate the capping layer.

BRIEF DESCRIPTION OF THE SEVERAL VIEWS OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
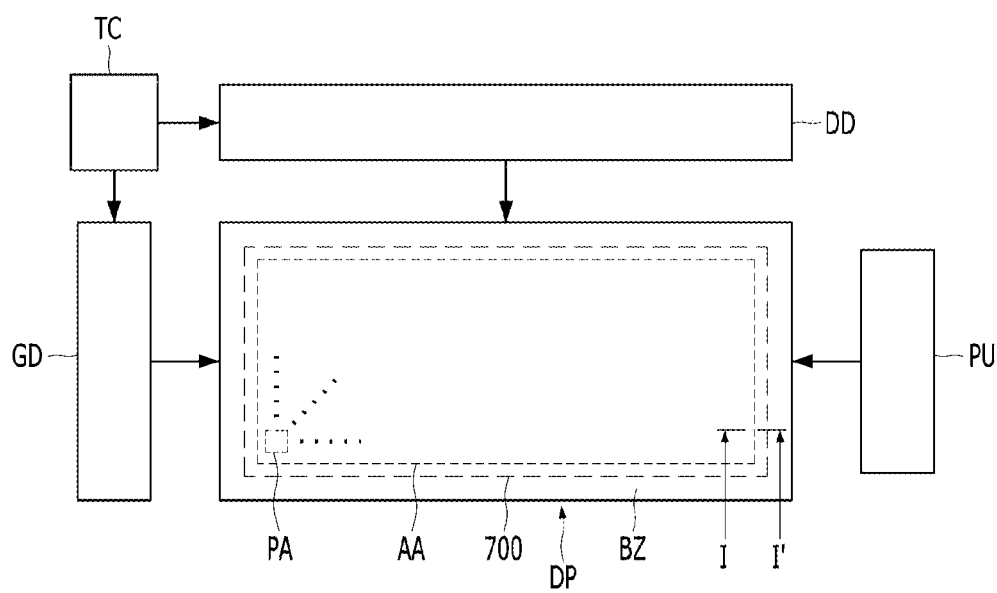
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
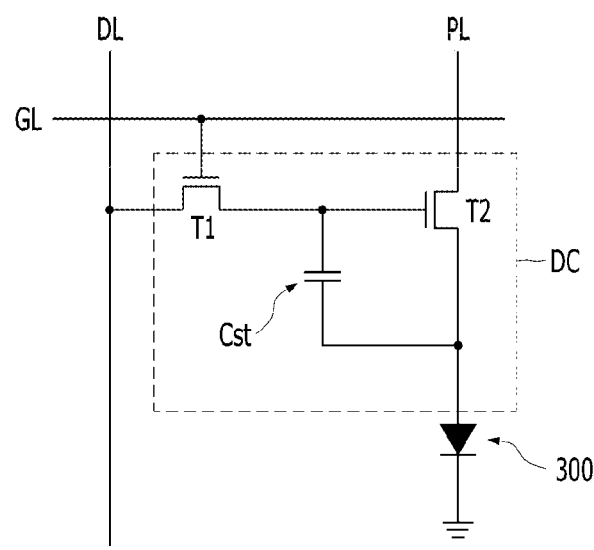
FIG. 2 is a view showing a circuit of a pixel area in the display apparatus according to the embodiment of the present disclosure.
Figure 3A:
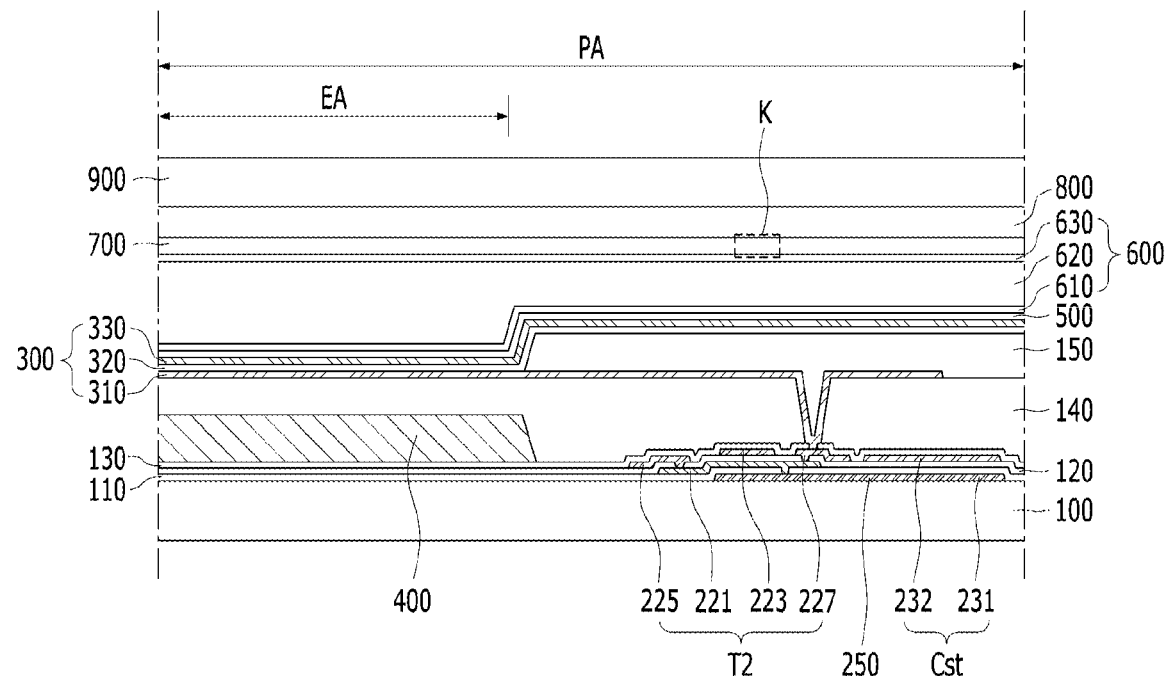
FIG. 3A is a view showing a cross section of the pixel area in the display apparatus according to the embodiment of the present disclosure.
Figure 3B:
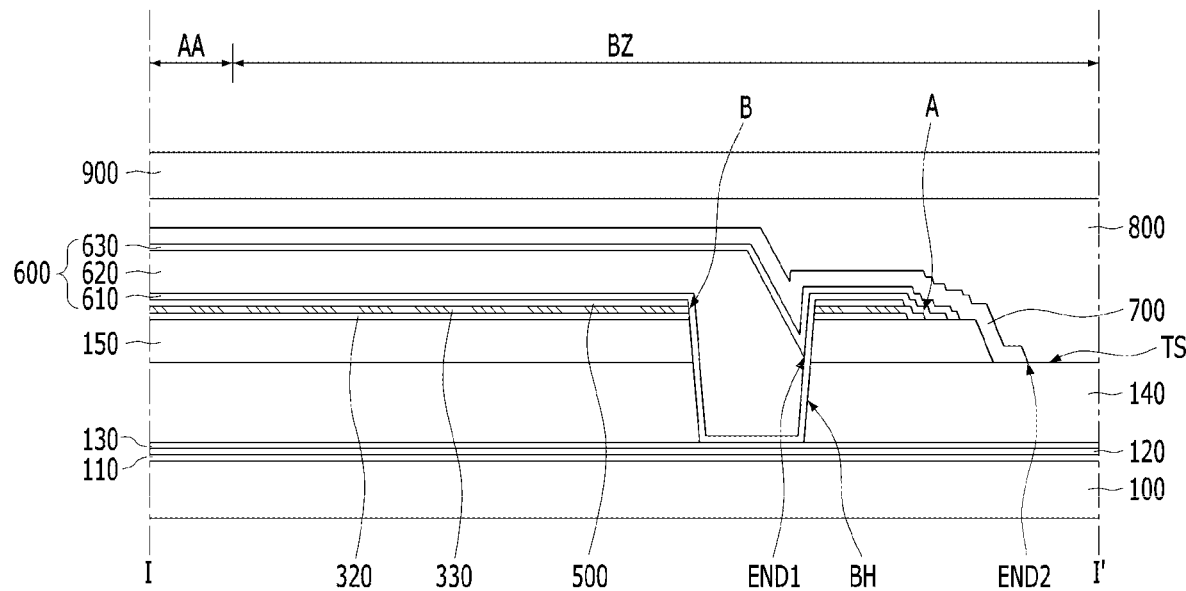
FIG. 3B is a view taken along I-I' of FIG. 1.

FIG. 1 is a view schematically showing a display apparatus according to an embodiment of the present disclosure. FIG. 2 is a view showing a circuit of a pixel area in the display apparatus according to the embodiment of the present disclosure. FIG. 3A is a view showing a cross section of the pixel area in the display apparatus according to the embodiment of the present disclosure. FIG. 3B is a view taken along I-I' of FIG. 1.

Referring to FIGS. 1, 2, 3A and 3B, the display apparatus according to the embodiment of the present disclosure may include a display panel DP, a data driver DD, a gate driving GD, a timing controller TC and a power unit PU.

The display panel DP may generate an image being provided to a user. For example, the display panel DP may include a plurality of pixel area PA. The data driver DD, the gate driver GD, the timing controller TC and the power unit PU may provide a signal for the operation of each pixel area PA through signal lines DL, GL and PL. The signal lines DL, GL and PL may include data lines DL, gate lines GL and power voltage supply lines PL. For example, the data driver DD may apply a data signal to each pixel area PA through the data lines DL, the gate driver GD may apply a gate signal to each pixel area PA through the gate lines GL, and the power unit PU may supply a power voltage to each pixel area PA through the power voltage supply lines PL. The timing controller TC may control the data driver DD and the gate driver GD. For example, the data driver DD may receive digital video data and a source timing control signal from the timing controller TC, and the gate driver GD may receive clock signals, reset clock signals and start signals from the timing controller TC.

Each of the pixel areas PA may realize a specific color. For example, a light-emitting device 300 may be disposed in each pixel area PA. The light-emitting device 300 may emit light realizing a specific color. For example, the light-emitting device 300 may include a first electrode 310, a light-emitting layer 320 and a second electrode 330, which are sequentially stacked on a device substrate 100. The device substrate 100 may include an insulating material. The device substrate 100 may include a transparent material. For example, the device substrate 100 may include glass or plastic.

The first electrode 310 may include a conductive material. The first electrode 310 may have a high transmittance. For example, the first electrode 310 may be a transparent electrode made of a transparent conductive material, such as ITO and IZO.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the embodiment of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 may be improved.

The second electrode 330 may include a conductive material. The second electrode 330 may include a material different from the first electrode 310. The reflectance of the second electrode 330 may be higher than the reflectance of the first electrode 310. For example, the second electrode 330 may include a metal, such as aluminum (Al) and silver (Ag). Thus, in the display apparatus according to the embodiment of the present disclosure, the light generated by the light-emitting layer 320 may be emitted outside through the first electrode 310 and the device substrate 100.

The pixel driving circuit DC electrically connected to the light-emitting device 300 may be disposed in each pixel area PA. The operation of the light-emitting device 300 in each pixel area PA may be controlled by the pixel driving circuit DC of the corresponding pixel area PA. The pixel driving circuit DC of each pixel area PA may be electrically connected to one of the data lines DL, one of the gate lines GL, and one of the power voltage supply lines PL. For example, the pixel driving circuit DC of each pixel area PA may supply a driving current corresponding to the data signal to the light-emitting device 300 of the corresponding pixel area PA according to the gate signal. The driving current generated by the pixel driving circuit DC of each pixel area PA may apply to the light-emitting device 300 of the corresponding pixel area PA for one frame. For example, the pixel driving circuit DC of each pixel area PA may include a first thin film transistor T1, a second thin film transistor T2 and a storage capacitor Cst.

The first thin film transistor T1 may include a first semiconductor pattern, a first gate electrode, a first source electrode and a first drain electrode. The second thin film transistor T2 may have the same structure as the first thin film transistor T1. For example, the second thin film transistor T2 may include a second semiconductor pattern 221, a second gate electrode 223, a second source electrode 225 and a second drain electrode 227.

The first semiconductor pattern and the second semiconductor pattern 221 may include a semiconductor material. For example, the first semiconductor pattern and the second semiconductor pattern 221 may include an oxide semiconductor, such as IGZO. The second semiconductor pattern 221 may include the same material as the first semiconductor pattern. For example, the second semiconductor pattern 221 may be disposed on the same layer as the first semiconductor pattern. The second semiconductor pattern 221 may be formed simultaneously with the first semiconductor pattern.

Each of the first semiconductor pattern and the second semiconductor pattern 221 may include a source region, a channel region and a drain region. The channel region may be disposed between the source region and the drain region. The source region and the drain region may have a resistance lower than the channel region. For example, the source region and the drain region may include a conductorized region of an oxide semiconductor. The channel region may be a region of an oxide semiconductor, which may be not a conductorized.

The first gate electrode and the second gate electrode 223 may include a conductive material. For example, the first gate electrode and the second gate electrode 223 may include a metal, such as aluminum (Al), chrome (Cr), copper (Cu), molybdenum (Mo), titanium (Ti) and tungsten (W). The second gate electrode 223 may include the same material as the first gate electrode. For example, the second gate electrode 223 may be disposed on the same layer as the first gate electrode. The second gate electrode 223 may be formed simultaneously with the first gate electrode.

The first gate electrode may be disposed on the first semiconductor pattern. For example, the first gate electrode may overlap the channel region of the first semiconductor pattern. The first gate electrode may be insulated from the first semiconductor pattern. For example, the channel region of the first semiconductor pattern may have an electric conductivity corresponding to a voltage applied to the first gate electrode. The second gate electrode 223 may be disposed on the second semiconductor pattern 221. For example, the second gate electrode 223 may overlap the channel region of the second semiconductor pattern 221. The second gate electrode 223 may be insulated from the second semiconductor pattern 221. The channel region of the second semiconductor pattern 221 may have an electric conductivity corresponding to a voltage applied to the second gate electrode 223.

The first source electrode, the first drain electrode, the second source electrode 225 and the second drain electrode 227 may include a conductive material. For example, the first source electrode, the first drain electrode, the second source electrode 225 and the second drain electrode 227 may include a metal, such as aluminum (Al), chrome (Cr), copper (Cu), molybdenum (Mo), titanium (Ti) and tungsten (W). The first drain electrode may include the same material as the first source electrode. For example, the first drain electrode may be disposed on the same layer as the first source electrode. The first drain electrode may be formed simultaneously with the first source electrode. The second drain electrode 227 may include the same material as the second source electrode 225. For example, the second drain electrode 227 may be disposed on the same layer as the second source electrode 225. The second drain electrode 227 may be formed simultaneously with the second source electrode 225.

The first source electrode and the first drain electrode may include the same material as the first gate electrode. For example, the first source electrode and the first drain electrode may be disposed on the same layer as the first gate electrode. The first source electrode and the first drain electrode may be formed simultaneously with the first gate electrode. The first source electrode and the first drain electrode may be insulated from the first gate electrode. For example, the first source electrode and the first drain electrode may be spaced away from the first gate electrode.

The second source electrode 225 and the second drain electrode 227 may include the same material as the second gate electrode 223. For example, the second source electrode 225 and the second drain electrode 227 may be disposed on the same layer as the second gate electrode 223. The second source electrode 225 and the second drain electrode 227 may be formed simultaneously with the second gate electrode 223. The second source electrode 225 and the second drain electrode 227 may be insulated from the second gate electrode 223. For example, the second source electrode 225 and the second drain electrode 227 may be spaced away from the second gate electrode 223.

The first source electrode may be electrically connected to the source region of the first semiconductor pattern. The first drain electrode may be electrically connected to the drain region of the first semiconductor pattern. The second source electrode 225 may be electrically connected to the source region of the second semiconductor pattern 221. The second drain electrode 227 may be electrically connected to the drain region of the second semiconductor pattern 221. The second source electrode 225 and the second drain electrode 227 may include the same material as the first source electrode and the first drain electrode. For example, the second source electrode 225 and the second drain electrode 227 may be disposed on the same layer as the first source electrode and the first drain electrode. The second source electrode 225 and the second drain electrode 227 may be formed simultaneously with the first source electrode and the first drain electrode. The first source electrode, the first drain electrode, the second source electrode 225 and the second drain electrode 227 may be spaced away from each other.

The thin film transistors T1 and T2 of each pixel area PA may be disposed between the device substrate 100 and the light-emitting device 300 of the corresponding pixel area PA. At least one of insulating layers 110, 120, 130, 140 and 150 may be disposed on the device substrate 100. Thus, in the display apparatus according to the embodiment of the present disclosure, unnecessary connection between the thin film transistors T1 and T2 and the light-emitting device 300 of each pixel area PA may be prevented. For example, a device buffer layer 110, a gate insulating layer 120, a lower passivation layer 130, an over-coat layer 140 and a bank insulating layer 150 may be disposed on the device substrate 100.

The device buffer layer 110 may include an insulating material. For example, the device buffer layer 110 may include an inorganic insulating material, such as silicon oxide (SiO) and silicon nitride (SiN). The device buffer layer 110 may include a multi-layer structure. For example, the device buffer layer 110 may have a stacked structure of a layer made of silicon nitride (SiN) and a layer made of silicon oxide (SiO).

The device buffer layer 110 may be disposed between the device substrate 100 and the thin film transistors T1 and T2 of each pixel area PA. The device buffer layer 110 may prevent pollution due to the device substrate 100 in a process of forming the thin film transistors T1 and T2. For example, an entire surface of the device substrate 100 toward the thin film transistors T1 and T2 of each pixel area PA may be covered by the device buffer layer 110. The thin film transistors T1 and T2 of each pixel area PA may be disposed on the device buffer layer 110.

The gate insulating layer 120 may include an insulating material. For example, the gate insulating layer 120 may include an inorganic insulating material, such as silicon oxide (SiO) and silicon nitride (SiN). The gate insulating layer 120 may include a material having a high dielectric constant. For example, the gate insulating layer 120 may include a High-K material, such as hafnium oxide (HfO). The gate insulating layer 120 may have a multi-layer structure.

The gate insulating layer 120 may be disposed on the device buffer layer 110. The gate insulating layer 120 may extend between the semiconductor pattern 221 and the gate electrode 223 of each thin film transistor T1 and T2. For example, the gate electrode 223 of each thin film transistor T1 and T2 may be insulated from the semiconductor pattern 221 of the corresponding thin film transistor T1 and T2 by the gate insulating layer 120. The gate insulating layer 120 may cover the first semiconductor pattern and the second semiconductor pattern 221 of each pixel area PA. The first gate electrode and the second gate electrode 223 of each pixel area PA may be disposed on the gate insulating layer 120.

The first source electrode, the first drain electrode 217, the second source electrode 225 and the second drain electrode 227 of each pixel area PA may be disposed on the gate insulating layer 120. For example, the gate insulating layer 120 of each pixel area PA may include a first source contact hole exposing the source region of the first semiconductor pattern, a first drain contact hole exposing the drain region of the first semiconductor pattern, a second source contact hole exposing the source region of the second semiconductor pattern 221, and a second drain contact hole exposing the drain region of the second semiconductor pattern 221.

The lower passivation layer 130 may include an insulating material. For example, the lower passivation layer 130 may include an inorganic insulating material, such as silicon oxide (SiO) and silicon nitride (SiN).

The lower passivation layer 130 may be disposed on the gate insulating layer 120. The lower passivation layer 130 may prevent the damage of each thin film transistor T1 and T2 due to external impact and moisture. For example, the first gate electrode, the first source electrode, the first drain electrode, the second gate electrode 223, the second source electrode 225 and the second drain electrode 227 of each pixel area PA may be covered by the lower passivation layer 130. The lower passivation layer 130 may extend along a surface of each thin film transistor T1 and T2 opposite to the device substrate 100. The lower passivation layer 130 may be in direct contact with the gate insulating layer 120 at the outside of the thin film transistors T1 and T2 in each pixel area PA.

The over-coat layer 140 may include an insulating material. The over-coat layer 140 may include a material different from the lower passivation layer 130. For example, the over-coat layer 140 may include an organic insulating material.

The over-coat layer 140 may be disposed on the lower passivation layer 130. The over-coat layer 140 may remove a thickness difference due to the thin film transistors T1 and T2 of each pixel area PA. For example, an upper surface of the over-coat layer 140 opposite to the device substrate 100 may be a flat surface. The first electrode 310, the light-emitting layer 320 and the second electrode 330 of the light-emitting device 300 may be sequentially stacked on the upper surface of the over-coat layer 140. Thus, in the display apparatus according to the embodiment of the present disclosure, the characteristics deviation due to the generating position difference of the light emitted outside through the device substrate 100 may be prevented.

The bank insulating layer 150 may include an insulating material. For example, the bank insulating layer 150 may include an organic insulating material. The bank insulating layer 150 may include a material different from the over-coat layer 140.

The bank insulating layer 150 may be disposed on the over-coat layer 140. The first electrode 310 of each light-emitting device 300 may be insulated from the first electrode 310 of adjacent light-emitting device 300 by the bank insulating layer 150. For example, the bank insulating layer 150 may cover an edge of the first electrode 310 in each pixel area PA. Thus, in the display apparatus according to the embodiment of the present disclosure, the light-emitting device 300 of each pixel area PA may be independently controlled by the bank insulating layer 150. The light-emitting layer 320 and the second electrode 330 of each light-emitting device 300 may be stacked on a portion of the corresponding first electrode 310 exposed by the bank insulating layer 150. For example, the bank insulating layer 150 may define emission area EA.

The emission area EA of each pixel area PA defined by the bank insulating layer 150 may be not overlap with the pixel driving circuit DC of the corresponding pixel area PA. For example, the thin film transistors T1 and T2 of each pixel area PA may be disposed outside the emission area EA of the corresponding pixel area PA. Thus, in the display apparatus according to the embodiment of the present disclosure, the light emitted from the light-emitting device 300 of each pixel area PA may be not blocked by the thin film transistors T1 and T2 of the corresponding pixel area PA.

The light-emitting layer 320 of each light-emitting device 300 may be connected to the light-emitting layer 320 of adjacent light-emitting device 300. For example, the light-emitting layer 320 of each light-emitting device 300 may extend on the bank insulating layer 150. The light emitted from the light-emitting device 300 of each pixel area PA may display the same color as the light emitted from the light-emitting device 300 of adjacent pixel area PA. For example, the light-emitting layer 320 of each pixel area PA may generate white light.

Each of the pixel areas PA may realize a color different from adjacent pixel area PA. For example, each of the pixel area PA may include a color filter 400 overlapping with the emission area EA of the corresponding pixel area PA. The color filter 400 may realize a specific color using the light passing through the corresponding color filter 400. For example, the color filter 400 of each pixel area PA may be disposed on a path of the light emitted from the light-emitting device 300 in the corresponding pixel area PA. The color filter 400 of each pixel area PA may be disposed between the device substrate 100 and the light-emitting device 300 of the corresponding pixel area PA. For example, the color filter 400 of each pixel area PA may be disposed between the device passivation layer 130 and the over-coat layer 140. A thickness difference due to the color filter 400 of each pixel area PA may be removed by the over-coat layer 140.

A voltage applied to the second electrode 330 of each light-emitting device 300 may be the same as a voltage applied to the second electrode 330 of adjacent light-emitting device 300. For example, the second electrode 330 of each light-emitting device 300 may be electrically connected to the second electrode 330 of adjacent light-emitting device 300. The second electrode 330 of each light-emitting device 300 may include the same material as the second electrode 330 of adjacent light-emitting device 300. For example, the second electrode 330 of each light-emitting device 300 may be formed simultaneously with the second electrode 330 of adjacent light-emitting device 300. Thus, in the display apparatus according to the embodiment of the present disclosure, a process of forming the second electrode 330 of each light-emitting device 300 may be simplified.

A light-blocking pattern 250 may be disposed between the device substrate 100 and each thin film transistor T1 and T2. For example, the light-blocking pattern 250 may be disposed between the device substrate 100 and the device buffer layer 110. The light-blocking pattern 250 may include a material capable of absorbing or reflecting the light. The light-blocking pattern 250 may include a conductive material. For example, the light-blocking pattern 250 may include a metal, such as aluminum (Al), chrome (Cr), copper (Cu), molybdenum (Mo), titanium (Ti) and tungsten (W).

External light travelling in a direction of the semiconductor pattern 221 of each thin film transistor T1 and T2 may be blocked by the light-blocking pattern 250. For example, the semiconductor pattern 221 of each thin film transistor T1 and T2 may include a region overlapping with the light-blocking pattern 250. Thus, in the display apparatus according to the embodiment of the present disclosure, a characteristics change of each thin film transistor T1 and T2 due to the external light may be prevented.

The first thin film transistor T1 of each pixel driving circuit DC may transmit the data signal to the second thin film transistor T2 of the corresponding pixel driving circuit DC according to the gate signal. For example, the first gate electrode of each pixel driving circuit DC may be electrically connected to one of the gate lines GL, and the first source electrode of each pixel driving circuit DC may be electrically connected to one of the data lines DL. The second thin film transistor T2 of each pixel driving circuit DC may generate the driving current corresponding to the data signal. For example, the second gate electrode 223 of each pixel driving circuit DC may be electrically connected to the first drain electrode of the corresponding pixel driving circuit DC, and the second source electrode 225 of each pixel driving circuit DC may be electrically connected to one of the power voltage supply lines PL. The driving current generated by the second thin film transistor T2 of each pixel area PA may be provided to the light-emitting device 300 of the corresponding pixel area PA. For example, the first electrode 310 of each pixel area PA may be electrically connected to the second drain electrode 227 of the corresponding pixel area PA.

The gate lines GL may be disposed on the same layer as the gate electrode 223 of each thin film transistor T1 and T2. For example, the gate lines GL may be disposed between the gate insulating layer 120 and the lower passivation layer 130. The gate lines GL may include the same material as the gate electrode 223 of each thin film transistor T1 and T2. For example, the gate lines GL may be formed simultaneously with the gate electrode 223 of each thin film transistor T1 and T2. The first gate electrode of each pixel area PA may be in direct contact with the corresponding gate line GL.

The data lines DL may intersect the gate lines GL. The data lines DL may be disposed on a layer different from the gate lines GL. For example, the data lines DL may be disposed between the device substrate 100 and the device buffer layer 110. The data lines DL may include the same material as the light-blocking pattern 250. For example, the data lines DL may be formed simultaneously with the light-blocking pattern 250. The device buffer layer 110 and the gate insulating layer 120 may include data contact holes exposing a portion of each data line DL. The first source electrode of each pixel area PA may be connected to the corresponding data line DL through one of the data contact holes.

The power voltage supply lines PL may extend in parallel to the data lines DL. For example, the power voltage supply lines PL may intersect the gate lines GL. The power voltage supply lines PL may be disposed on the same layer as the data lines DL. For example, the power voltage supply lines PL may be disposed between the device substrate 100 and the device buffer layer 110. The power voltage supply lines PL may include the same material as the data lines DL. For example, the power voltage supply lines PL may be formed simultaneously with the data lines DL. The device buffer layer 110 and the gate insulating layer 120 may include power contact holes exposing a portion of each power voltage supply line PL. The second source electrode 225 of each pixel area PA may be connected to the corresponding power voltage supply line PL through one of the power contact holes.

The storage capacitor Cst of each pixel driving circuit DC may maintain a signal applied to the second gate electrode 223 of the corresponding pixel driving circuit DC for one frame. For example, the storage capacitor Cst of each pixel driving circuit DC may be electrically connected between the second gate electrode 223 and the second drain electrode 227 of the corresponding pixel driving circuit DC. The storage capacitor Cst of each pixel driving circuit DC may have a stacked structure of at least two capacitor electrodes 231 and 232. For example, the storage capacitor Cst of each pixel driving circuit DC may have a stacked structure of a first capacitor electrode 231 and a second capacitor electrode 232. The second capacitor electrode 232 of each pixel driving circuit DC may be disposed on the first capacitor electrode 231 of the corresponding pixel driving circuit DC. The second capacitor electrode 232 of each pixel driving circuit DC may be insulated from the first capacitor electrode 231 of the corresponding pixel driving circuit DC. The storage capacitor Cst of each pixel driving circuit DC may be formed using a conductive layer disposed between the device substrate 100 and the over-coat layer 140. For example, the first capacitor electrode 231 of each pixel driving circuit DC may be disposed between the device substrate 100 and the device buffer layer 110, and the second capacitor electrode 232 of each pixel driving circuit DC may be disposed between the device buffer layer 110 and the gate insulating layer 120.

The first capacitor electrode 231 of each pixel driving circuit DC may include the same material as the light-blocking pattern 250. For example, the first capacitor electrode 231 of each pixel driving circuit DC may include a metal, such as aluminum (Al), chrome (Cr), copper (Cu), molybdenum (Mo), titanium (Ti), tungsten (W), or some combination thereof. The first capacitor electrode 231 of each pixel driving circuit DC may be formed simultaneously with the light-blocking pattern 250. For example, the first capacitor electrode 231 of each pixel driving circuit DC may be in direct contact with the light-blocking pattern 250 disposed in the corresponding pixel area PA.

The first capacitor electrode 231 of each pixel driving circuit DC may be electrically connected to the second drain electrode 227 of the corresponding pixel driving circuit DC. For example, the first capacitor electrode 231 of each pixel driving circuit DC may be connected to the second drain electrode 227 of the corresponding pixel driving circuit DC by the light-blocking pattern 250 and the drain region of the second semiconductor pattern 221, which are disposed in the corresponding pixel area PA. The drain region of the second semiconductor pattern 221 in each pixel area PA may be electrically connected to the light-blocking pattern 250 in the corresponding pixel area PA. For example, the device buffer layer 110 may include storage contact holes between the light-blocking pattern 250 and the drain region of the second semiconductor pattern 221 in each pixel area PA. The drain region of the second semiconductor pattern 221 in each pixel area PA may be connected to the light-blocking pattern 250 in the corresponding pixel area PA through one of the storage contact holes.

The second capacitor electrode 232 of each pixel driving circuit DC may include the same material as the semiconductor patterns 221 of the corresponding pixel driving circuit DC. For example, the second capacitor electrode 232 of each pixel driving circuit DC may include an oxide semiconductor, such as IGZO. The second capacitor electrode 232 of each pixel driving circuit DC may be formed simultaneously with the semiconductor patterns 221 of the corresponding pixel driving circuit DC. The second capacitor electrode 232 of each pixel driving circuit DC may have a resistance lower than the channel region of each semiconductor pattern 221 disposed in the corresponding pixel driving circuit DC. For example, the second capacitor electrode 232 of each pixel driving circuit DC may include a conductorized region of an oxide semiconductor.

The display panel DP may include a display area AA in which the pixel areas PA are disposed, and a bezel area BZ disposed outside the display area AA. For example, the light-emitting devices 300 may be disposed on the over-coat layer 130 of the display area AA. The bezel area BZ may surround the display area AA. Signal wirings DL, GL and PL may be connected to the pixel driving circuit DC of each pixel area PA by passing through the bezel area BZ. For example, the data lines DL, the gate lines GL and the power voltage supply lines PL, which are electrically connected to the pixel driving circuit DC of each pixel area PA may extend on the bezel area BZ of the device substrate 100.

At least one of insulating layers 110, 120, 130, 140 and 150 for insulating between the signal wirings DL, GL and PL may be disposed on the bezel area BZ of the device substrate 100. For example, the device buffer layer 110, the gate insulating layer 120, the lower passivation layer 130, the over-coat layer 140 and the bank insulating layer 150 may extend onto the bezel area BZ of the device substrate 100. The device buffer layer 110, the gate insulating layer 120, the lower passivation layer 130, the over-coat layer 140 and the bank insulating layer 150 may be sequentially stacked on the bezel area BZ of the device substrate 100

A blocking pattern BH is also referred to as a moisture-blocking hole BH throughout the disclosure. Therefore, the term blocking pattern BH and the moisture-blocking hole BH may be used interchangeably. However, the blocking pattern BH is not limited to merely blocking moisture and the structure is also capable of blocking any foreign, external materials that can degrade the function of the light-emitting device. The moisture-blocking hole BH may be disposed on the bezel area BZ of the device substrate 100. The moisture-blocking hole BH may block the penetration of external moisture through the insulating layers 110, 120, 130, 140 and 150, which are disposed on the bezel area BZ. For example, the moisture-blocking hole BH may penetrate the over-coat layer 140 and the bank insulating layer 150, which are made of an organic insulating material. A portion of the lower passivation layer 130 being made of an inorganic insulating material may be exposed by the moisture-blocking hole BH. Thus, in the display apparatus according to the embodiment of the present disclosure, the penetration of the external moisture into the display area AA may be blocked by the moisture-blocking hole BH. Therefore, in the display apparatus according to the embodiment of the present disclosure, the deterioration of the light-emitting layer 320 due to the external moisture may be prevented.

The light-emitting layer 320 and the second electrode 330 of each light-emitting device 300 may extend onto the bezel area BZ of the device substrate 100. The moisture-blocking hole BH may extends through (or penetrate) the light-emitting layer 320 and the second electrode 330 of each light-emitting device 300 on the bezel area BZ. Thus, in the display apparatus according to the embodiment of the present disclosure, the penetration of the external moisture may be effectively prevented. A region having a minimum area for securing the reliability of moisture permeation prevention within the bezel area BZ may be referred to as a reliability bezel region. The reliability bezel region may be defined from an end of an encapsulation substrate 900 to an end of the second electrode 330. The moisture-blocking hole BH may penetrate the light-emitting layer 320 and the second electrode 330 of each light-emitting device 300 on the bezel area BZ, such that the reliability bezel region may be expanded by a difference between an end A of the second electrode 330 which is not penetrated, and an end B of the second electrode 330 which is penetrated. The moisture-blocking hole BH may be disposed between the end A of the second electrode 330 which is not penetrated, and the end B of the second electrode 330 which is penetrated. The end B of the second electrode 330 which is penetrated may be disposed on the same layer as the end A of the second electrode 330 which is not penetrated.

The moisture-blocking hole BH may be formed using a laser ablation process. For example, a step of forming the moisture-blocking hole BH may include a step of irradiating a portion of the bezel area BZ in which the over-coat layer 140, the bank insulating layer 150, the light-emitting layer 320 and the second electrode 330 are stacked, to sequentially remove a portion of the second electrode 330, a portion of the light-emitting layer 320, a portion of the bank insulating layer 150, and a portion the over-coat layer 140. This process also exposes the side surfaces of various layers including the capping layer 500, the second electrode 330, the light-emitting layer 320, the bank insulating layer 150, the over-coat layer 140 as shown in FIG. 3B. Thus, in the display apparatus according to the embodiment of the present disclosure, the process of forming the moisture-blocking pattern may be simplified. Therefore, in the display apparatus according to the embodiment of the present disclosure, the process efficiency may be improved.

An encapsulating element 600 may be disposed on the second electrode 330 of each light-emitting device 300. The encapsulating element 600 may prevent the damage of the light-emitting devices 300 due to external impact and moisture. The encapsulating element 600 may have a multi-layer structure. For example, the encapsulating element 600 may include a first encapsulating layer 610, a second encapsulating layer 620 and a third encapsulating layer 630, which are sequentially stacked. The first encapsulating layer 610, the second encapsulating layer 620 and the third encapsulating layer 630 may include an insulating material. The second encapsulating layer 620 may include a material different from the first encapsulating layer 610 and the third encapsulating layer 630. For example, the first encapsulating layer 610 and the third encapsulating layer 630 may be an inorganic insulating layer including an inorganic insulating material, and the second encapsulating layer 620 may be an organic insulating layer including an organic insulating material. Thus, in the display apparatus according to the embodiment of the present disclosure, the damage of the light-emitting devices 300 due to the external impact and moisture may be effectively prevented.

The encapsulating element 600 may extend onto the bezel area BZ of the device substrate 100. The encapsulating element 600 may fill at least a portion of the moisture-blocking hole BH. For example, the flow of the second encapsulating layer 620 including an organic insulating material may be blocked by the moisture-blocking hole BH. The moisture-blocking hole BH may have a closed curve shape extending along an edge of the display area AA. For example, a formation region of the second encapsulating layer 620 may be defined by the moisture-blocking hole BH.

An end of the second encapsulating layer 620 may be disposed inside the moisture-blocking hole BH. The first encapsulating layer 610 and the third encapsulating layer 630, which include an inorganic insulating material may extend outside the moisture-blocking hole BH. For example, the end of the second encapsulating layer 620 may be surrounded by the first encapsulating layer 610 and the third encapsulating layer 630. Thus, in the display apparatus according to the embodiment of the present disclosure, the flow of the second encapsulating layer 620 may be blocked, without forming additional dam. Therefore, in the display apparatus according to the embodiment of the present disclosure, the process efficiency may be improved.

And, in the display apparatus according to the embodiment of the present disclosure, the penetration of the external moisture may be prevented by the encapsulating element 600 in the moisture-blocking hole BH. That is, in the display apparatus according to the embodiment of the present disclosure, the deterioration of the light-emitting layer 320 due to the external moisture may be significantly reduced. Therefore, in the display apparatus according to the embodiment of the present disclosure, the quality of the image provided to the user may be effectively improved.

In one embodiment, as shown in FIG. 3B, the moisture-blocking hole BH completely extends through the over-coat layer 140 and the bank insulating layer 150. The first capping layer 610 is disposed on the moisture-blocking hole BH and covers the top surface and side surface of the capping layer 500 and the side surfaces of the second electrode 330, the light-emitting layer 320, the bank insulating layer 150, and the over-coat layer 140. The first capping layer 610 also directly contacts the lower passivation layer 130. This is merely one example embodiment and the depth of the moisture-blocking hole BH may differ based on various designs and applications of the display device.

Referring to FIG. 3B, the third encapsulating layer 630 extends downward towards the moisture-blocking hole BH to contact a side surface of the first encapsulating layer 610. The point that the third encapsulating layer 630 contacts with the side surface of the first encapsulating layer 610 horizontally overlaps with the bank insulating layer 150 as shown in the illustration. However, in a different embodiment, a point that the third encapsulating layer 630 contacts with the side surface of the first encapsulating layer 610 may horizontally overlap with the over-coat layer 140. The variable adhesive layer 700 subsequently deposited over the third encapsulating layer 630 may have a corresponding shape (e.g., a V-shape, or a sawtooth like shape, or a triangular like shape) as the third encapsulating layer 630.

A capping layer 500 may be disposed between the second electrode 330 of each light-emitting device 300 and the encapsulating element 600. The capping layer 500 may relieve the external impact. The capping layer 500 may include an insulating material. For example, the capping layer 500 may include an inorganic insulating material, such as silicon oxide (SiO) and silicon nitride (SiN). The capping layer 500 may include a material different from the first encapsulating layer 610. Thus, in the display apparatus according to the embodiment of the present disclosure, the deterioration of the light-emitting layer 320 due to the external moisture may be effectively prevented.

The capping layer 500 may extend onto the bezel area BZ of the device substrate 100 along between the second electrode 330 of each light-emitting device 300 and the encapsulating element 600. The moisture-blocking hole BH may penetrate the capping layer 500. For example, the laser ablation process for forming the moisture-blocking hole BH may be performed after forming the capping layer 500. Thus, in the display apparatus according to the embodiment of the present disclosure, the flow of the second encapsulating layer 620 may be effectively blocked by the moisture-blocking hole BH.

An encapsulation substrate 900 may be attached on the encapsulating element 600 by a front adhesive layer 800. The encapsulation substrate 900 may prevent the damage of the light-emitting devices 300 due to the external impact and moisture. For example, the encapsulation substrate 900 may include a material having a specific hardness or more. The encapsulation substrate 900 may include a material having relatively high thermal conductivity. For example, the encapsulation substrate 900 may include a metal, such as aluminum (Al), nickel (Ni) and iron (Fe). Thus, in the display apparatus according to the embodiment of the present disclosure, the heat generated by the pixel driving circuit DC and the light-emitting device 300 of each pixel area PA may be dissipated through the encapsulation substrate 900. Therefore, in the display apparatus according to the embodiment of the present disclosure, the deterioration of the light-emitting layers 320 may be effectively prevented.

The front adhesive layer 800 may include an adhesive material. The front adhesive layer 800 may extend onto the bezel area BZ of the device substrate 100. The encapsulating element 600 may be covered by the front adhesive layer 800. For example, the front adhesive layer 800 and the encapsulation substrate 900 may overlap the display area AA and the bezel area BZ of the device substrate 100. A lower surface of the encapsulation substrate 900 toward the device substrate 100 may be parallel to an upper surface of the device substrate 100 toward the encapsulation substrate 900. For example, the front adhesive layer 800 on the bezel area BZ of the device substrate 100 may be thicker than the front adhesive layer 800 on the display area AA of the device substrate 100.

Figure 4:
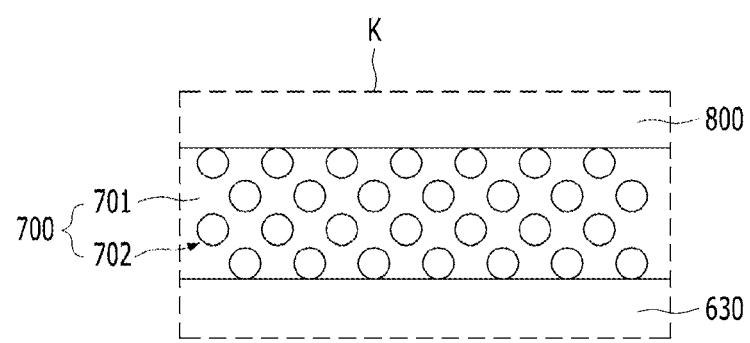
FIGS. 4 and 5 are views showing the state of a variable adhesive layer according to external environment in the display apparatus according to the embodiment of the present disclosure.
Figure 5:
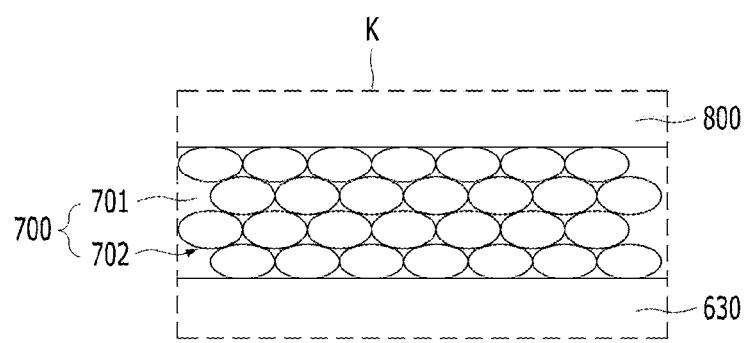

FIG. 4 is an enlarged view of area K shown in FIG. 3A when the variable beads 702 are spaced apart from each other. FIG. 5 is an enlarged view of area K shown in FIG. 3A when the variable beads 702 are expanded to contact each other. A variable adhesive layer 700 may be disposed between the encapsulating element 600 and the front adhesive layer 800 of the display area AA. The adhesive force of the variable adhesive layer 700 may be lowered under specific conditions. For example, the variable adhesive layer 700 may include an adhesive material layer 701 and variable beads 702 dispersed in the adhesive material layer 701, and the variable beads 702 may include a material in which a volume is changed by a specific conditions, as shown in FIG. 4. The volume of each variable bead 702 may be increased by heating or UV irradiation. For example, each of the variable beads 702 may be a thermally expandable microcapsule containing hydrocarbons that expand by heating (e.g., temperature). Thus, in the display apparatus according to the embodiment of the present disclosure, if the variable adhesive layer 700 is heated or UV is irradiated to the variable adhesive layer 700, the volume of each variable bead 702 may be increased, and the adhesive material layer 701 may be separated from the inside, as shown in FIG. 5. That is, in the display apparatus according to the embodiment of the present disclosure, the adhesive force of the variable adhesive layer 700 may be lowered by an increase in the volume of each variable bead 702. Therefore, in the display apparatus according to the embodiment of the present disclosure, the coupling force between the encapsulating element 600 and the front adhesive layer 800 may be selectively lowered by the variable adhesive layer 700.

The variably adhesive layer 700 may extend onto the bezel area BZ of the device substrate 100 along between the encapsulating element 600 and the front adhesive layer 800, as shown in FIGS. 3A and 3B. For example, an end of the variable adhesive layer 700 may be in direct contact with the over-coat layer 140 of the bezel area BZ. That is, FIG. 3B illustrates the end of the variable adhesive layer 700 directly contacting a top surface TS of the over-coat layer 140 in the bezel area BZ. For instance, an end END2 of the variably adhesive layer 700 contacts the top surface TS of the over-coat layer 140 in the bezel area BZ. The variable adhesive layer 700 may extend beyond the moisture-blocking hole BH. For example, the bank insulating layer 150, the light-emitting layer 320, the second electrode 330, the capping layer 500 and the encapsulating element 600 may be covered by the variable adhesive layer 700. Thus, the display apparatus according to the embodiment of the present disclosure may reduce the adhesive force of the variable adhesive layer 700 to prevent the damage of the light-emitting devices 300 due to the separation process of the encapsulation substrate 900. That is, in the display apparatus according to the embodiment of the present disclosure, the encapsulation substrate 900 may be separated, without the damage of the light-emitting devices 300. Therefore, in the display apparatus according to the embodiment of the present disclosure, the process efficiency and the productivity may be improved.

Accordingly, in the display apparatus according to the embodiment of the present disclosure, the moisture-blocking hole BH may be disposed on the bezel area BZ of the device substrate 100, and the variable adhesive layer 700 may be disposed between the encapsulating element 600 covering the light-emitting devices 300 and the front adhesive layer 800, wherein the variable adhesive layer 700 in which adhesive force is lowered under a specific conditions may extend beyond the encapsulating element 600. Thus, in the display apparatus according to the embodiment of the present disclosure, the penetration of the external moisture may be prevented by expanding the reliability bezel region in the bezel area BZ, and the damage of the light-emitting devices 300 due to the separation process of the encapsulation substrate 900 for re-work may be prevented. Therefore, in the display apparatus according to the embodiment of the present disclosure, the process efficiency and the productivity may be improved.

Figure 6:
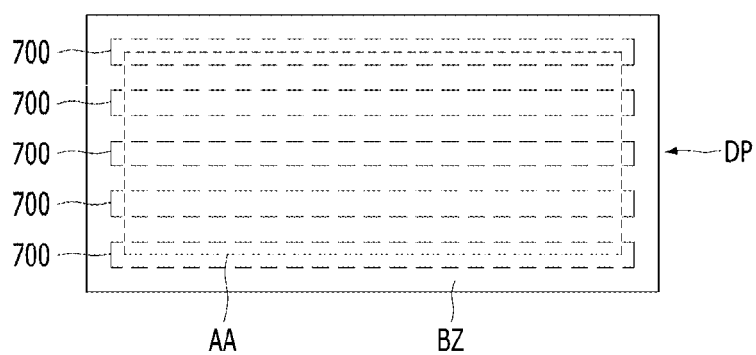
FIG. 6 is a view of a variable adhesive layer covering only a portion of a display area of the display apparatus according to an embodiment of the present disclosure.
Figure 7:
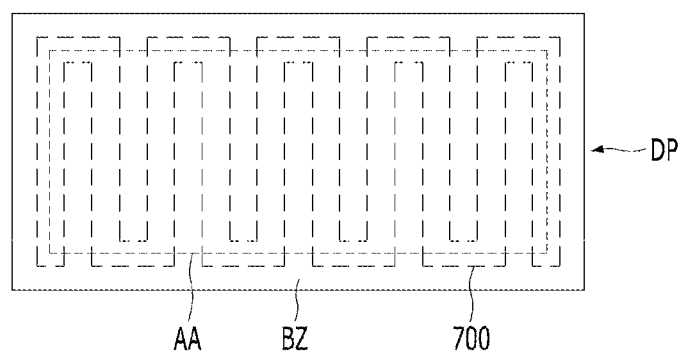
FIG. 7 is a view of a variable adhesive layer covering only a portion of a display area of the display apparatus according to another embodiment of the present disclosure.

The display apparatus according to the embodiment of the present disclosure is described that the variable adhesive layer 700 covers the display area AA of the device substrate 100, completely (that is, throughout the entire display area AA of the device substrate 100). However, in the display apparatus according to another embodiment of the present disclosure, the variable adhesive layer 700 may cover only a portion of the display area AA. For example, the display apparatus according to another embodiment of the present disclosure may include a plurality of variable adhesive layer 700 having a bar shape extending in a first direction, wherein the variable adhesive layer 700 may be spaced away for each other in a second direction transverse (e.g., FIG. 6 shows it as being perpendicular) to the first direction, as shown in FIG. 6. Alternately, in the display apparatus according to another embodiment of the present disclosure, a planar shape of the variable adhesive layer 700 may have a specific pattern, as shown in FIG. 7. For instance, the variable adhesive layer 700 may have a square wave or a rectangular wave like pattern seen from a plan view. The variable adhesive layer 700 may also be continuous and contiguous (contrary to the example pattern shown in FIG. 6). Thus, in the display apparatus according to another embodiment of the present disclosure, the degree of freedom for the shape of the variable adhesive layer 700 may be improved.

Figure 8A:
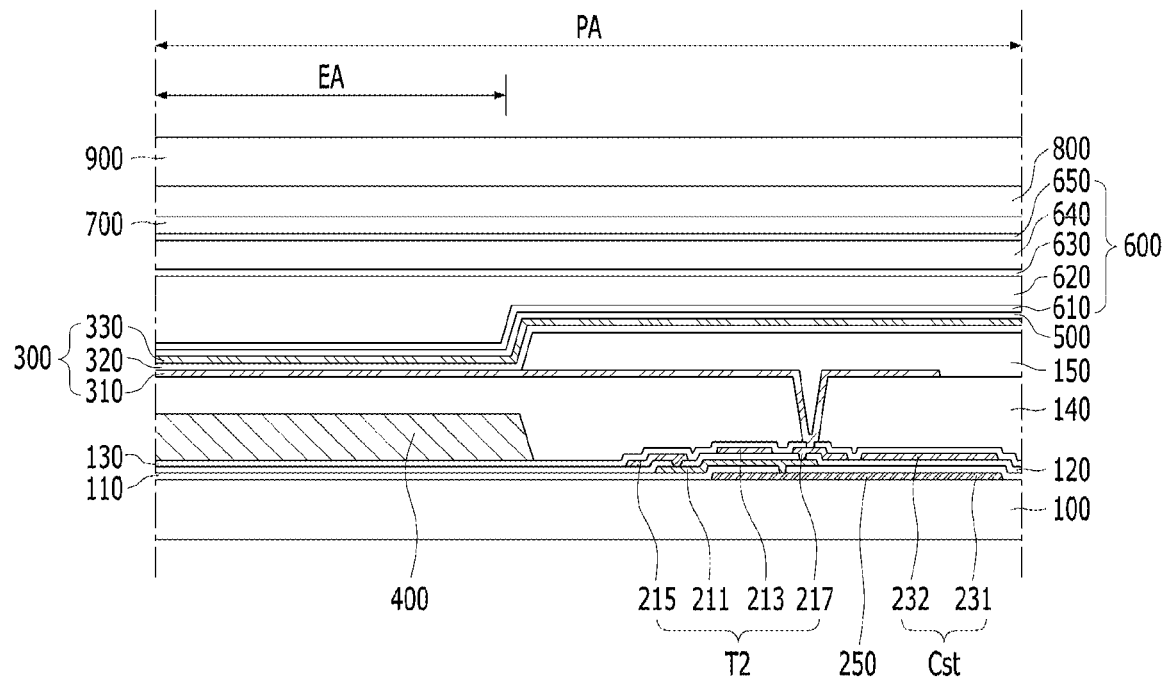
FIG. 8A is a cross-sectional view showing an encapsulating element having various stacked structures in a pixel area of a display apparatus according to an embodiment of the present disclosure.
Figure 8B:
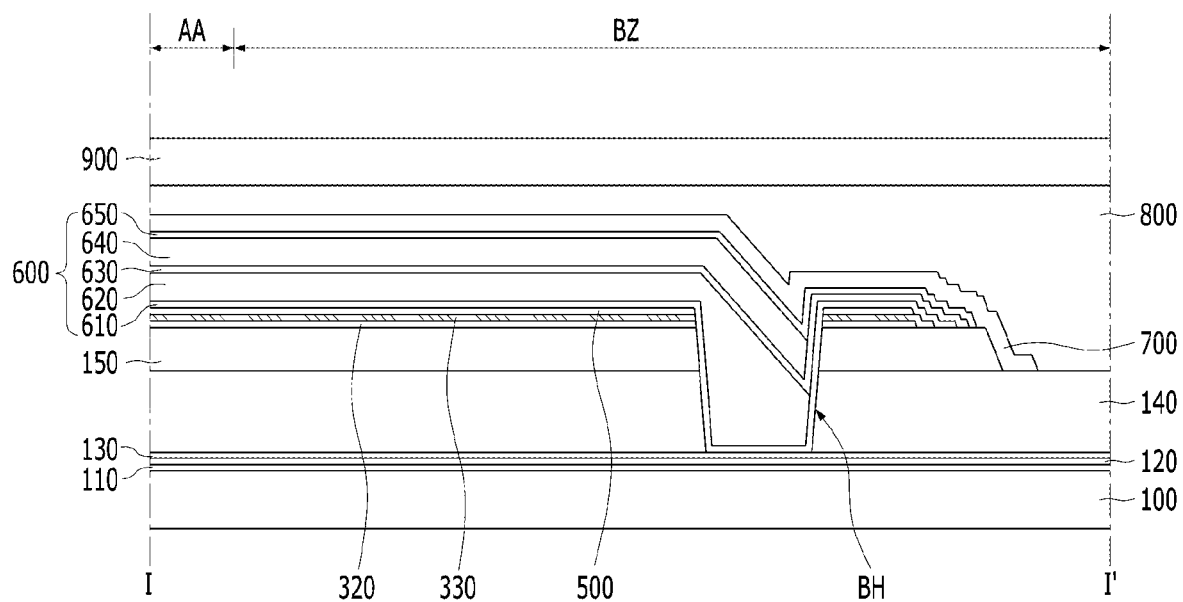
FIG. 8B is a view taken along I-I' of FIG. 1 according to another embodiment of the present disclosure including an encapsulating element having various stacked structures.

The display apparatus according to the embodiment of the present disclosure is described that the encapsulating element 600 has a three-layer structure. However, in the display apparatus according to another embodiment of the present disclosure, the encapsulating element 600 may have various stacked structures. For example, in the display apparatus according to another embodiment of the present disclosure, the encapsulating element 600 may have a stacked structure of a first encapsulating layer 610, a second encapsulating layer 620, a third encapsulating layer 630, a fourth encapsulating layer 640 and a fifth encapsulating layer 650, as shown in FIGS. 8A and 8B. The first encapsulating layer 610, the third encapsulating layer 630 and the fifth encapsulating layer 650 may be an inorganic insulating layer including an inorganic insulating material. The second encapsulating layer 620 and the fourth encapsulating layer 640 may be an organic insulating layer including an organic insulating material. For example, an end of the second encapsulating layer 620 and an end of the fourth encapsulating layer 640 may be disposed inside the moisture-blocking hole BH. Thus, in the display apparatus according to another embodiment of the present disclosure, the degree of freedom for the shape of the encapsulating element 600 may be improved. Therefore, in the display apparatus according to another embodiment of the present disclosure, the penetration of the external moisture may be effectively prevented by the encapsulating element 600.

Referring to FIG. 8B, the third encapsulating layer 630 extends downward towards the moisture-blocking hole BH to contact a side surface of the first encapsulating layer 610. The point END1 that the third encapsulating layer 630 contacts with the side surface of the first encapsulating layer 610 horizontally overlaps with the over-coat layer 140 as shown in the illustration. However, in a different embodiment, a point that the third encapsulating layer 630 contacts with the side surface of the first encapsulating layer 610 may horizontally overlap with a different layer (e.g., layer 150). The layers 640, 650 that is subsequently deposited over the third encapsulating layer 630 may have a corresponding shape (e.g., a V-shape, or a sawtooth like shape, or a triangular like shape) as shown in the illustration. The adhesive layer 700 subsequently deposited over the layer 650 may also have a corresponding shape as the third encapsulating layer 630 (or the other subsequently deposited layers).

In one embodiment, first, second, third, fourth, fifth encapsulating layers may have different thickness from each other. Further, they may be arranged in a way that a layer that have a smaller thickness is interposed between layers with greater thickness. For instance, the second encapsulating layer 620 is thicker than the first encapsulating layer 610, and the third encapsulating layer 630 is thinner than the second encapsulating layer 620, and the fourth encapsulating layer 640 is thicker than the third encapsulating layer 630, and the fifth encapsulating layer 650 is thinner than the fourth encapsulating layer 640.

In one embodiment, the first encapsulating layer 610 and the third encapsulating layer 630 and the fifth encapsulating layer 650 may have the same thickness as each other. However, the present disclosure is not limited to these example dimensions.

Figure 9:
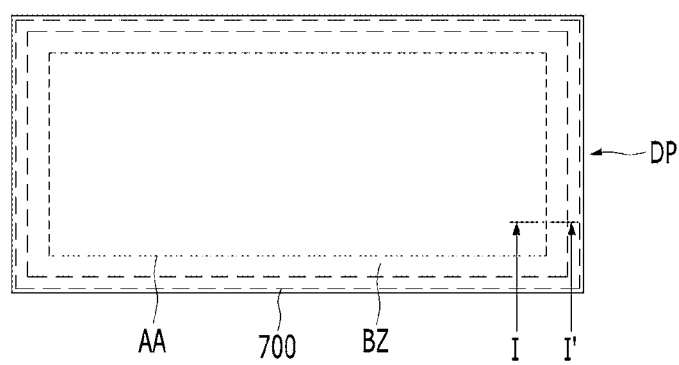
FIG. 9 is a view of a variable adhesive layer disposed between an over-coat layer and a front adhesive layer of a bezel area according to an embodiment of the present disclosure.
Figure 10A:
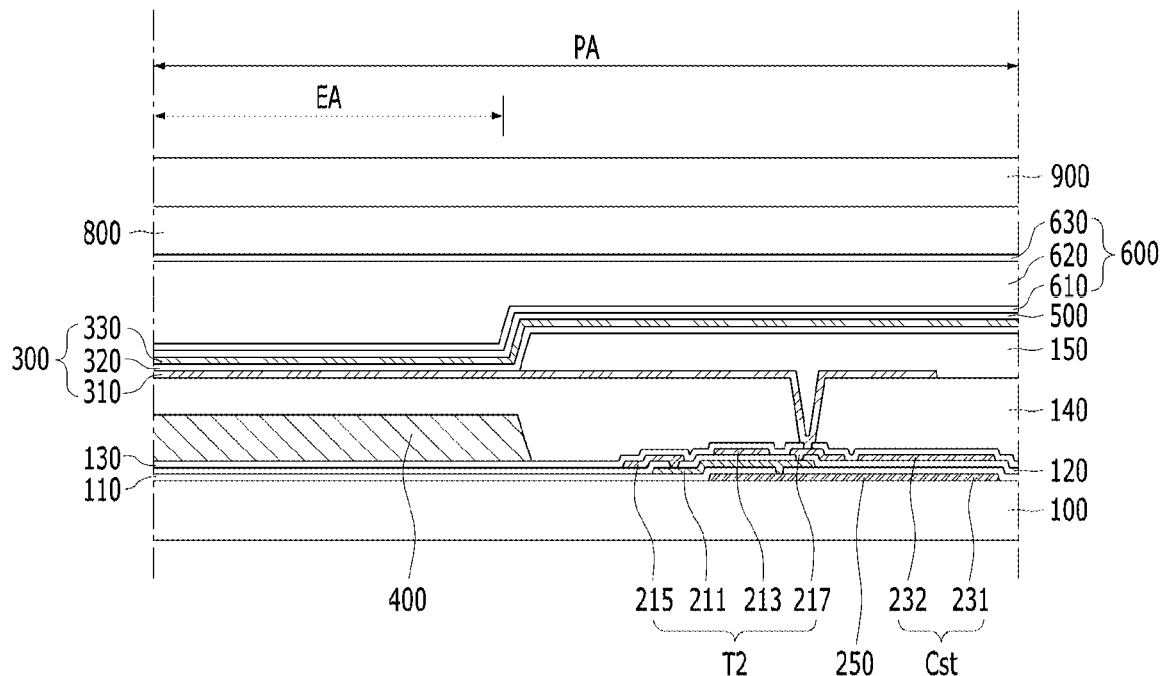
FIG. 10A is a view showing a cross section of the pixel area in the display apparatus according to the embodiment shown in FIG. 9.
Figure 10B:
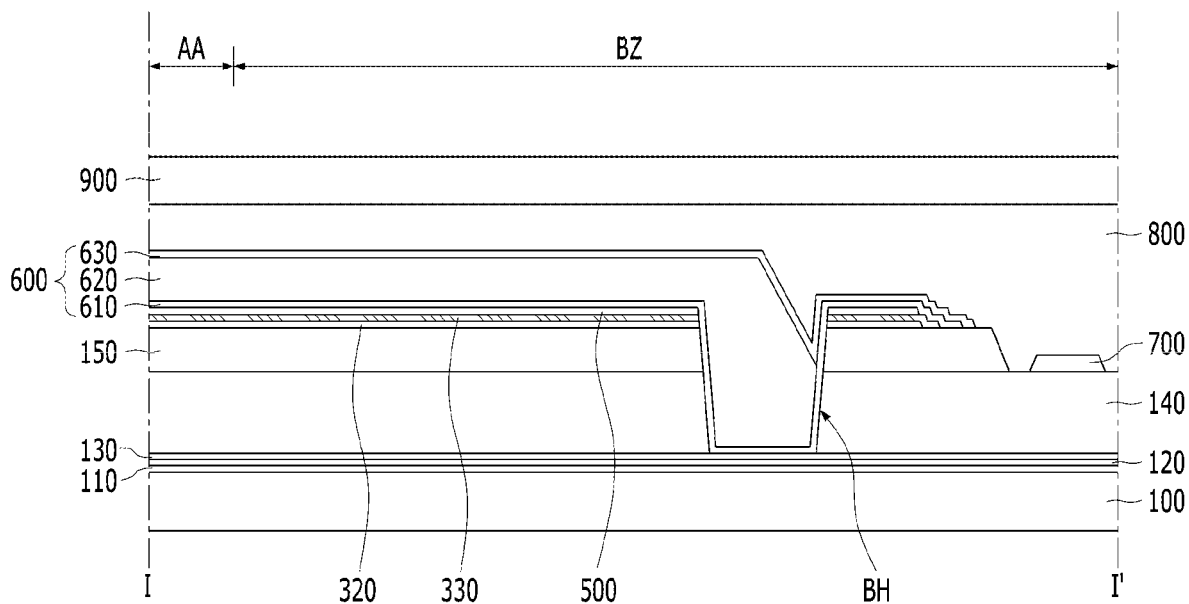
FIG. 10B is a view taken along I-I' of FIG. 9.

The display apparatus according to the embodiment of the present disclosure is described that the variable adhesive layer 700 is disposed between the third encapsulating layer 630 which is an inorganic encapsulating layer, and the front adhesive layer 800. However, in the display apparatus according to another embodiment of the present disclosure, the variable adhesive layer 700 may be disposed between organic layers. For example, in the display apparatus according to another embodiment of the present disclosure, the variable adhesive layer 700 may be disposed between the over-coat layer 140 and the front adhesive layer 800 of the bezel area BZ, as shown in FIGS. 9, 10A and 10B. The variable adhesive layer 700 may be spaced away from the display area AA. For example, the variable adhesive layer 700 may have a closed curve shape extending along an edge of the display area AA. The variable adhesive layer 700 may be disposed outside the moisture-blocking hole BH. For example, the bank insulating layer 150, the light-emitting layer 320, the second electrode 330 and the encapsulating element 600 may be disposed in a region defined by the variable adhesive layer 700. The variable adhesive layer 700 may surround the encapsulating element 600. For example, the variable adhesive layer 700 may be spaced away from the encapsulating element 600.

The front adhesive layer 800 of the display area AA may be in direct contact with the third encapsulating layer 630 including an inorganic insulating material. The front adhesive layer 800 may include an organic material. For example, the front adhesive layer 800 may include olefin-based material. In general, the interface between the organic film and the organic film is not easily separated, compared with the interface between the inorganic film and the organic film. For example, one of the organic layers may be torn in the separation process of the stacked organic layers. Thus, in the display apparatus according to another embodiment of the present disclosure, the front adhesive layer 800 of the display area AA is in contact with the third encapsulating layer 630 including an inorganic insulating material, the variable adhesive layer 700 is disposed between the over-coat layer 140 and the front adhesive layer 800 of the bezel area BZ, such that the damage of the light-emitting devices 300 due to the separation process of the encapsulation substrate 900 for re-work may be prevented. Therefore, in the display apparatus according to another embodiment of the present disclosure, the process efficiency and the productivity may be greatly improved.

Figure 11:
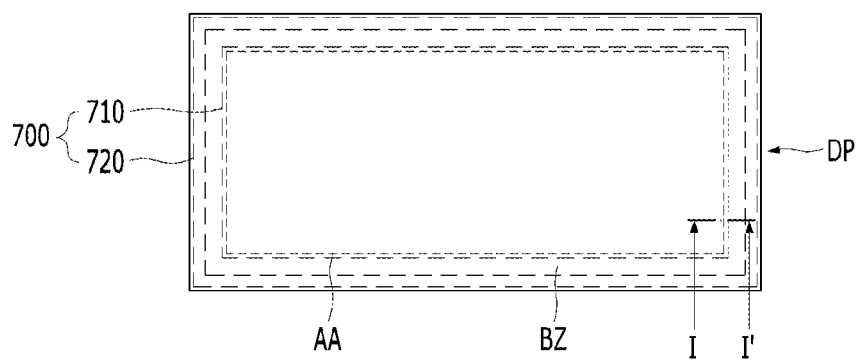
FIG. 11 is a view of a variable adhesive layer having an inner variable adhesive layer and an outer variable adhesive layer in a display apparatus according to another embodiment of the present disclosure.
Figure 12A:
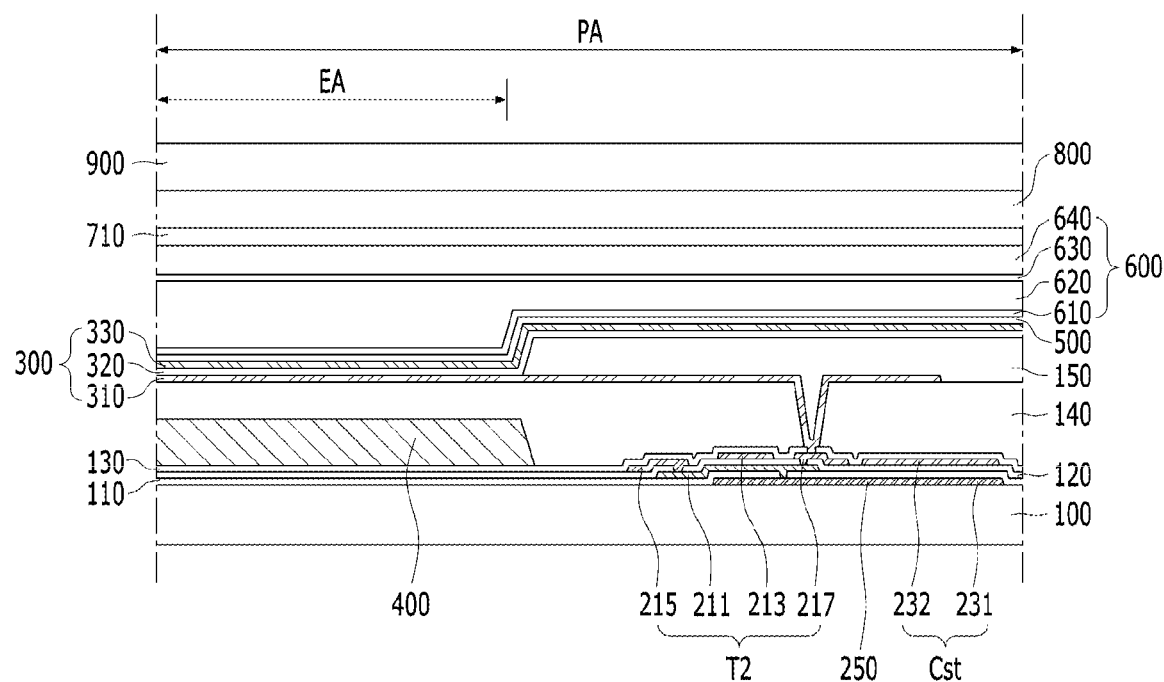
FIG. 12A is a view showing a cross section of the pixel area in the display apparatus according to the embodiment shown in FIG. 11.
Figure 12B:
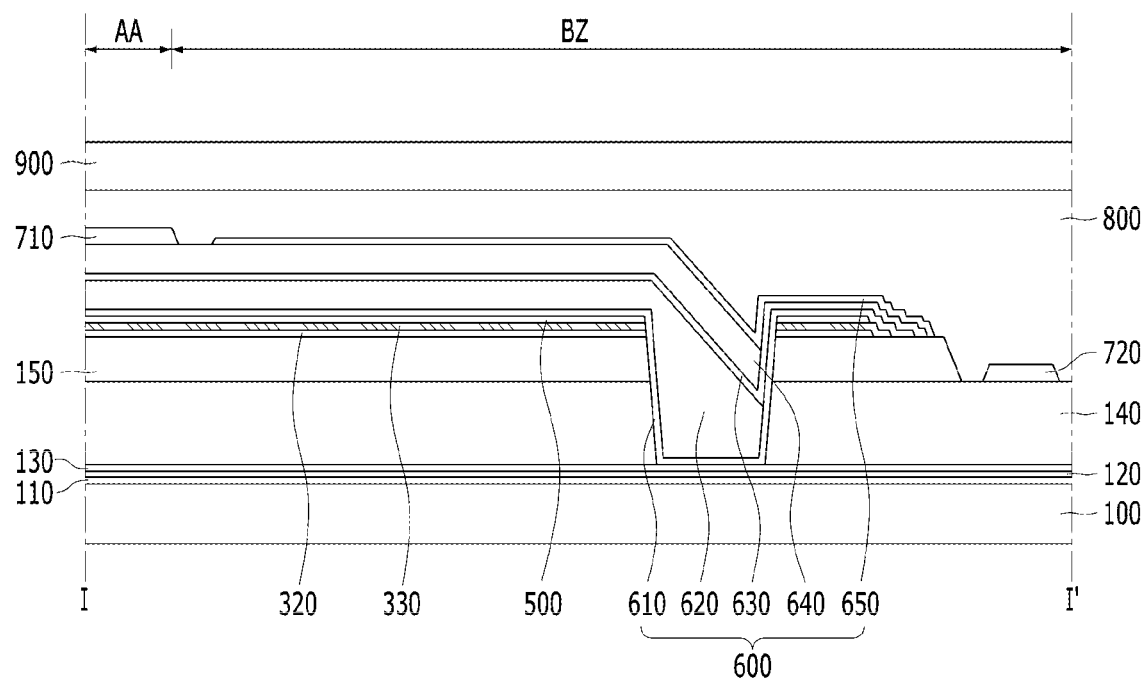
FIG. 12B is a view taken along I-I' of FIG. 11.

The display apparatus according to the embodiment of the present disclosure is described that the encapsulating element 600 has a stacked structure of an inorganic encapsulating layer and an organic encapsulating layer, wherein the uppermost layer of the encapsulating element 600 is an inorganic encapsulating layer. However, in the display apparatus according to another embodiment of the present disclosure, the encapsulating element 600 of the display area AA may have a stacked structure of the first encapsulating layer 610, the second encapsulating layer 620, the third encapsulating layer 630 and the fourth encapsulating layer 640, as shown in FIGS. 11, 12A and 12B. That is, in the display apparatus according to another embodiment of the present disclosure, the uppermost layer of the encapsulating element 600 in the display area AA may be the fourth encapsulating layer 640 including an organic insulating material. An inner variable adhesive layer 710 may be disposed between the fourth encapsulating layer 640 and the front adhesive layer 800 of the display area AA. Thus, in the display apparatus according to another embodiment of the present disclosure, the degree of freedom for the structure of the encapsulating element 600 may be improved.

In the display apparatus according to another embodiment of the present disclosure, an outer variable adhesive layer 720 may be disposed between the over-coat layer 140 and the front adhesive layer 800 of the bezel area BZ. The outer variable adhesive layer 720 may include the same material as the inner variable adhesive layer 710. For example, the adhesive force of the inner variable adhesive layer 710 and the adhesive force of the outer variable adhesive layer 720 may be simultaneously reduced by ultraviolet (UV) irradiation. Thus, in the display apparatus according to another embodiment of the present disclosure, the separation process of the encapsulation substrate 900 for re-work may be quickly performed.

The outer variable adhesive layer 720 may be spaced away from the inner variable adhesive layer 710. For example, the moisture-blocking hole BH may be disposed between the inner variable adhesive layer 710 and outer variable adhesive layer 720. The encapsulating element 600 may include the fifth encapsulating layer 650 covering an end of the fourth encapsulating layer 640 in the moisture-blocking hole BH. For example, the fifth encapsulating layer 650 may be disposed between the inner variable adhesive layer 710 and outer variable adhesive layer 720. Thus, in the display apparatus according to another embodiment of the present disclosure, the reliability bezel region may be expanded in the bezel area BZ, the penetration of the external moisture may be prevented, and the damage of the light-emitting devices 300 due to the separation process of the encapsulation substrate 900 may be prevented. Therefore, in the display apparatus according to another embodiment of the present disclosure, the process efficiency and the productivity may be significantly improved.

In the result, the display apparatus according to the embodiments of the present disclosure may comprise the encapsulating element disposed between the second electrode of the light-emitting device and the front adhesive layer, the variable adhesive layer disposed between the encapsulating element and the front adhesive layer, and the moisture-blocking hole disposed on the bezel area of the device substrate, wherein at least a portion of the moisture-blocking hole may be filled by the encapsulating element. Thus, in the display apparatus according to the embodiments of the present disclosure, the reliability bezel region may be expanded in the bezel area, the penetration of the external moisture may be prevented, and the damage of the light-emitting devices due to the separation process of the encapsulation substrate for re-work may be prevented. Thereby, in the display apparatus according to the embodiments of the present disclosure, the process efficiency and the productivity may be improved.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
an over-coat layer disposed on a display area and a bezel area of a device substrate;
a light-emitting device disposed on the over-coat layer of the display area;
a moisture-blocking hole disposed on the bezel area of the device substrate, the moisture-blocking hole extending through the over-coat layer;
an encapsulating element disposed on the light-emitting device, the encapsulating element filling at least a portion of the moisture-blocking hole;
a front adhesive layer disposed on the device substrate, the front adhesive layer covering the encapsulating element;
an encapsulation substrate disposed on the front adhesive layer, the encapsulation substrate overlapping with the display area and the bezel area of the device substrate; and
a variable adhesive layer disposed between the encapsulating element and the front adhesive layer.

2. The display apparatus according to claim 1, wherein the variable adhesive layer includes an adhesive material layer and variable beads dispersed in the adhesive material layer, and
wherein the variable beads include a material in which a volume is changed by heat or ultraviolet.

3. The display apparatus according to claim 1, wherein the encapsulating element has a stacked structure of an inorganic encapsulating layer including an inorganic insulating material, and an organic encapsulating layer including an organic insulating material.

4. The display apparatus according to claim 3, wherein an end of the organic encapsulating layer is disposed in the moisture-blocking hole.

5. The display apparatus according to claim 1, wherein the variable adhesive layer extends outside the display area along between the encapsulating element and the front adhesive layer.

6. The display apparatus according to claim 5, wherein an end of the variable adhesive layer is in contact with the over-coat layer of the bezel area.

7. A display apparatus, comprising:
an over-coat layer disposed on a display area and a bezel area of a device substrate;
a light-emitting device disposed on the over-coat layer of the display area, the light-emitting device including a first electrode, a light-emitting layer, and a second electrode;
a moisture-blocking hole disposed on the bezel area of the device substrate, the moisture-blocking hole penetrating the over-coat layer;
an encapsulation unit disposed on the light-emitting device; the encapsulation unit encapsulating the light-emitting device and the moisture-blocking hole; and
a variable adhesive layer disposed between the over-coat layer and the encapsulation unit,
wherein the second electrode is penetrated in the bezel area and have a first end and a second end separated from the first end, and
wherein the moisture-blocking hole is disposed between the first end and the second end of the second electrode.

8. The display apparatus according to claim 7, wherein the first end and the second end of the second electrode is disposed on the same layer on the over-coat layer.

9. The display apparatus according to claim 7, further comprising a capping layer on the light-emitting device; and wherein at least one among the first electrode, the light-emitting layer, the second electrode, and the capping layer is not penetrated in the moisture-blocking hole.

10. The display apparatus according to claim 7, further comprising an encapsulating element disposed on the second electrode; the encapsulating element including a first encapsulating layer extending inside the moisture-blocking hole.

11. The display apparatus according to claim 7, further comprising a bank insulating layer covering an edge of the first electrode, the bank insulating layer penetrated by the moisture-blocking hole in the bezel area.

12. The display apparatus according to claim 7, wherein the encapsulation unit is comprised of a front adhesive layer, and an encapsulation substrate, and the variable adhesive layer is disposed between the over-coat layer and the front adhesive layer of the bezel area.

13. The display apparatus according to claim 12, wherein the variable adhesive layer is disposed outside the light-emitting device in the bezel area.

14. The display apparatus according to claim 13, wherein the variable adhesive layer has a closed curve shape extending along an edge of the display area.

15. The display apparatus according to claim 13, further comprising an inner variable adhesive layer disposed between the over-coat layer and the front adhesive layer of the display area, the inner variable adhesive layer spaced apart from the variable adhesive layer.

16. A display apparatus, comprising:
a device substrate having thereon a display area and a bezel area adjacent to the display area;
a first electrode disposed on the display area and extending into the bezel area;
an over-coat layer disposed between the device substrate and the first electrode, the over-coat layer on the display area and the bezel area of the device substrate;
a light-emitting layer disposed on the first electrode;
a second electrode disposed on the light-emitting layer, the second electrode extending into the bezel area;
an encapsulating element disposed on the second electrode, the encapsulating element extending through the over-coat layer at the bezel area, the encapsulating element contacting a side surface of the over-coat layer; and
a variable adhesive layer disposed on the encapsulating element, the variable adhesive layer extending further towards the bezel area than the encapsulating element.

17. The display apparatus of claim 16, wherein the variable adhesive layer contacts a top surface of the over-coat layer at the bezel area.

18. The display apparatus of claim 16, comprising:
a front adhesive layer disposed on the variable adhesive layer, the front adhesive layer contacting a top surface of the over-coat layer at the bezel area;
an encapsulation substrate disposed on the front adhesive layer, the encapsulation substrate overlapping with the display area and the bezel area of the device substrate.

19. The display apparatus of claim 16, wherein the variable adhesive layer includes an adhesive material layer and variable beads dispersed within the adhesive material layer, the variable beads including a material in which a volume is changed based on temperature.

20. The display apparatus of claim 16, wherein the variable adhesive layer has a bar shape extending in a longitudinal direction that is spaced apart from each other when seen from a plan view.

21. The display apparatus of claim 16, wherein the variable adhesive layer is continuous and contiguous and has a square wave shape when seen from a plan view.

22. The display apparatus of claim 16, wherein the encapsulating element includes a multi-layer structure, the encapsulating element including:
- a first encapsulating layer;
- a second encapsulating layer on the first encapsulating layer; and
- a third encapsulating layer on the second encapsulating layer,
- wherein the first encapsulating layer directly contacts the side surface of the over-coat layer, and
- wherein the third encapsulating layer directly contacts only one side of a side surface of the first encapsulating layer.

23. The display apparatus of claim 22, wherein the encapsulating element includes:
- a fourth encapsulating layer on the third encapsulating layer; and
- a fifth encapsulating layer on the fourth encapsulating layer;
- wherein the second encapsulating layer is thicker than the first encapsulating layer,
- wherein the third encapsulating layer is thinner than the second encapsulating layer,
- wherein the fourth encapsulating layer is thicker than the third encapsulating layer, and
- wherein the fifth encapsulating layer is thinner than the fourth encapsulating layer.

* * * * *